(12) United States Patent
Kishida

(10) Patent No.: US 8,742,512 B2
(45) Date of Patent: Jun. 3, 2014

(54) BORDER BETWEEN SEMICONDUCTOR TRANSISTORS WITH DIFFERENT GATE STRUCTURES

(76) Inventor: Takeshi Kishida, Tokyo (JP)

( * ) Notice: Subject to any disclaimer, the term of this patent is extended or adjusted under 35 U.S.C. 154(b) by 12 days.

(21) Appl. No.: 13/609,866

(22) Filed: Sep. 11, 2012

(65) Prior Publication Data

US 2013/0075828 A1    Mar. 28, 2013

(30) Foreign Application Priority Data

Sep. 22, 2011  (JP) .................................. 2011-207329

(51) Int. Cl.
*H01L 21/70* (2006.01)
(52) U.S. Cl.
USPC .................... 257/369; 257/377; 257/E27.062
(58) Field of Classification Search
USPC .......................................... 257/369, E27.062
See application file for complete search history.

(56) References Cited

U.S. PATENT DOCUMENTS

| 2001/0015463 A1* | 8/2001 | Wakabayashi et al. ........ 257/371 |
| 2008/0128822 A1* | 6/2008 | Koyama et al. ............... 257/369 |

FOREIGN PATENT DOCUMENTS

| JP | 2006-024594 | 1/2006 |
| JP | 2007-329237 | 12/2007 |

* cited by examiner

*Primary Examiner* — Hsin-Yi Hsieh
(74) *Attorney, Agent, or Firm* — Young & Thompson

(57) ABSTRACT

A semiconductor device according to the invention includes: a first region on a semiconductor substrate, in which a first transistor is formed, the first transistor including first gate insulating film 4 containing a high dielectric constant material and first metal gate electrode 5 formed on first gate insulating film 4; a second region adjacent to the first region on the semiconductor substrate, in which a second transistor is formed, the second transistor including second gate insulating film 4 and second metal gate electrode 12 formed on the second gate insulating film, a layered structure of electrode materials of the second transistor being different from a layered structure of electrode materials of the first transistor; and a first and a second line, the lines being of different potentials, wherein a border between the first and the second region overlaps with at most only the first or the second line.

20 Claims, 19 Drawing Sheets

BORDER BETWEEN SEMICONDUCTOR TRANSISTORS WITH DIFFERENT GATE STRUCTURES

BACKGROUND OF THE INVENTION

1. Field of the Invention

The present invention relates to a semiconductor device including a transistor that has a HKMG structure.

2. Description of the Related Art

In a metal-insulator-semiconductor field-effect transistor (MISFET) that has a gate insulating film and a gate electrode formed on the gate insulating film, it has been a common practice to use a silicon oxide film, $SiO_2$ in this case, as the gate insulating film and a polysilicon film as the gate electrode.

Recently, the thickness of gate insulating film has been further reduced with miniaturization of MISFETs. One problem of a thinner gate insulating film is the relative increase in the strength of the electric field on the gate electrode, and is occurrence of depletion of the gate electrode composed of polysilicon. Another problem of a thinner gate insulating film is occurrence of the so-called tunnel current caused by electrons, which would flow through a channel, tunneling a bather formed by the silicon oxide film so as to flow through the gate electrode.

JP2007-329237A and JP2006-024594A disclose MISFETs that have a high dielectric constant gate insulating film (high-k insulating film) composed of a high dielectric constant material, the dielectric constant of which is higher than $SiO_2$, and a metal gate electrode composed of a metallic material. In the MISFETs, the metal gate electrode can prevent the depletion of the gate electrode, and the high-k insulating film can prevent the occurrence of tunnel current. An MISFET that has a high-k insulating film and a metal gate electrode is referred to as an MISFET that has a HKMG structure.

Description will now be made of a process of forming first and second MISFETs that have a HKMG structure and different threshold voltages on a semiconductor substrate. It is noted that the first MISFET is formed in a first region and the second MISFET is formed in a second region adjacent to the first region on the semiconductor substrate.

First, a high-k insulating film is deposited, and then an electrode material for a metal gate electrode of the first MISFET is deposited. The deposited electrode material is removed in all regions except for the first region. A first gate stack layer (first GS layer) in which the high-k insulating film and the electrode material for the metal gate electrode of the first MISFET are layered is thus formed in the first region.

Next, an electrode material for a metal gate electrode of the second MISFET is deposited, and then the deposited electrode material is removed in all regions except for the second region. A second gate stack layer (second GS layer) in which the high-k insulating film and the electrode material for the metal gate electrode of the second MISFET are layered is thus formed in the second region. Thereafter, the first and second GS layers are subject to gate processing, such as etching, to turn the layers into gates of the MISFETs.

The present inventor has now discovered a problem in which a residue of a GS layer is generated during the gate processing and the residue may cause short circuit lines.

In general, the electrode material for the metal gate electrode of the first MISFET deposited in all regions except for the first region is removed by wet etching in order to prevent damage to the high-k insulating film. At this time, wet etching may etch away electrode material included in a part of the first region, where the electrode material included in the part of the first region is carved to create an overhang portion. In the case where an overhang portion is generated, the electrode material for the metal gate electrode of the second MISFET may be trapped under the overhang portion. The electrode material trapped under the overhang portion impedes etching in the gate processing, and generates a residue of a GS layer on the border between the first region and the second region. The residue is conductive because the residue contains the electrode material for the metal gate electrode. Consequently, the residue causes a short circuit when the residue is in contact with two lines having different potentials.

SUMMARY

In one embodiment, there is provided a semiconductor device that includes:
a semiconductor substrate;
a first region on the semiconductor substrate, in which a first transistor is formed, the first transistor including a first gate insulating film containing a high dielectric constant material and a first metal gate electrode formed on the first gate insulating film;
a second region adjacent to the first region on the semiconductor substrate, in which a second transistor is formed, the second transistor including a second gate insulating film containing a high dielectric constant material and a second metal gate electrode formed on the second gate insulating film, a layered structure of electrode materials of the second transistor being different from a layered structure of electrode materials of the first transistor; and
a first line and a second line, the lines being of different potentials,
wherein a border between the first region and the second region overlaps with at most only the first line or the second line.

In another embodiment, there is provided a semiconductor device that includes:
a semiconductor substrate;
a first region on the semiconductor substrate, in which a first transistor is formed, the first transistor including a first gate insulating film and a first gate electrode formed on the first gate insulating film;
a second region adjacent to the first region on the semiconductor substrate, in which a second transistor is formed, the second transistor including a second gate insulating film and a second gate electrode formed on the second gate insulating film, a layered structure of electrode materials of the second transistor being different from a layered structure of electrode materials of the first transistor;
a first line and a second line, the lines being of different potentials,
wherein a border between the first region and the second region overlaps with at most only the first line or the second line.

According to the invention, the border between the first region, in which a first transistor that has a HKMG structure is formed, and the second region, in which a second transistor that has a HKMG structure is formed, the layered structure of electrode materials of which is different from that of the first transistor, overlaps with at most only the first line or the second line that are of different potentials. Accordingly, even if some residue is generated on the border between the first region and the second region, a short circuit can be prevented from occurring between the first line and the second line.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
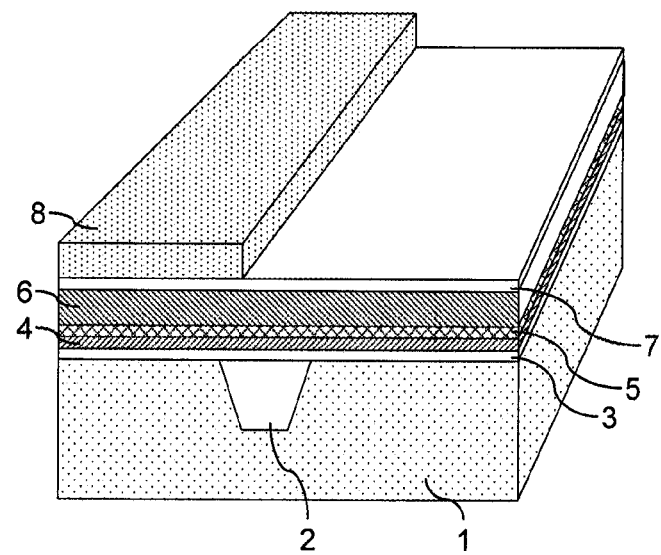
FIG. 1 is a schematic view illustrating a process of forming a gate stack layer for first and second MISFETs that has a HKMG structure.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Exemplary embodiments will now be described with reference to the drawings.

First, the mechanism of how residue, as described above, is generated will now be described in detail with reference to FIGS. 1 to 7. In FIGS. 1 to 7, same reference numerals represent same components, and the description will be omitted.

As shown in FIG. 1, a device isolation region, i.e. shallow trench isolation (STI) 2, is formed on Si substrate 1, which is a semiconductor substrate.

After STI 2 is formed, silicon oxide ($SiO_2$) film 3 is formed by thermal oxidation as an interlayer. After silicon oxide film 3 is formed, high-k insulating film 4 is deposited, which is composed of a high dielectric constant material, such as HfO (hafnium oxide) and HfSiO (hafnium silicate), whose dielectric consent is higher than $SiO_2$.

After high-k insulating film 4 is deposited, titanium nitride (TiN) film 5 is deposited, which is an electrode material for a metal gate electrode of a first MISFET. After titanium nitride film 5 is deposited, polysilicon film 6 is deposited. After polysilicon film 6 is deposited, silicon oxide ($SiO_2$) film 7 is deposited as a processing mask material. After silicon oxide film 7 is deposited, resist 8 is deposited on a first region.

Figure 2:
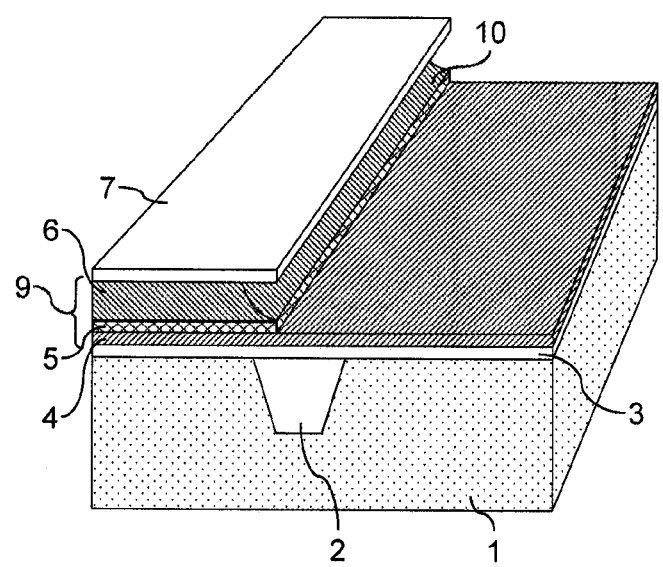
FIG. 2 is a schematic view illustrating a process of forming a gate stack layer for first and second MISFETs that has a HKMG structure.

As shown in FIG. 2, after resist 8 is deposited, lithography or the like is used to perform patterning. After patterning, dry etching is used to process silicon oxide film 7. Thereafter, dry etching is further performed to remove silicon oxide film 7 deposited in all regions except for the first region. After silicon oxide film 7 is removed, wet etching is performed to remove titanium nitride film 5 and polysilicon film 6 deposited in all regions except for the first region. Specifically, polysilicon film 6 is first etched by aqueous ammonia, and titanium nitride film 5 is then etched by ammonia-hydrogen peroxide mixture (APM) liquid.

The wet etching removes titanium nitride film 5 and polysilicon film 6 deposited in all regions except for the first region to form first GS layer 9, in which high-k insulating film 4 as a first insulating film, titanium nitride film 5 as a first metal gate electrode, and polysilicon film 6 are layered.

At this time, as shown in FIG. 2, wet etching also etches away polysilicon film 6 and the like deposited in the first region, and generates overhang portion 10.

Figure 3:
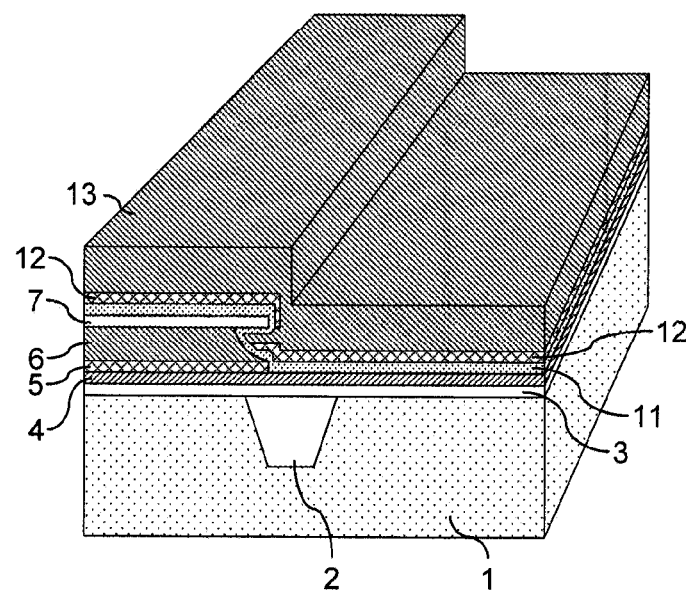
FIG. 3 is a schematic view illustrating a process of forming a gate stack layer for first and second MISFETs that has a HKMG structure.

After first GS layer 9 is formed, aluminum oxide (AlO) film 11 is deposited as shown in FIG. 3. After aluminum oxide film 11 is deposited, an electrode material for a metal gate electrode of a second MISFET, i.e. titanium nitride film 12, the composition of which is different from titanium nitride film 5, aluminum oxide film 11 and titanium nitride film 12 thus deposited provide the second MISFET with a layered structure of electrode materials that is different from that of the first MISFET. Accordingly, the first and second MISFETs have a threshold voltage different from each other.

After titanium nitride film 12 is deposited, polysilicon film 13 is deposited. At this time, as shown in FIG. 3, aluminum oxide film 11, titanium nitride film 12, and polysilicon film 13 are trapped under overhang portion 10.

Figure 4:
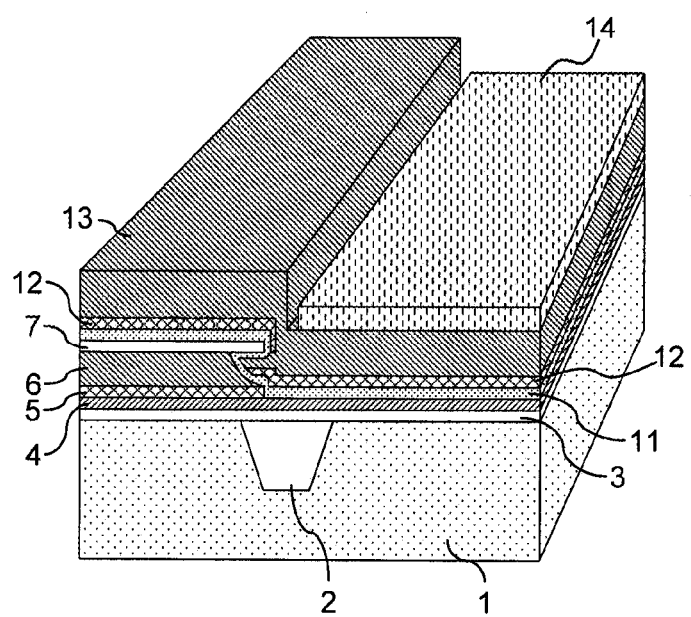
FIG. 4 is a schematic view illustrating a process of forming a gate stack layer for first and second MISFETs that has a HKMG structure.

Next, as shown in FIG. 4, resist 14 is deposited on a second region. After resist 14 is deposited, lithography or the like is used to perform patterning.

Figure 5:
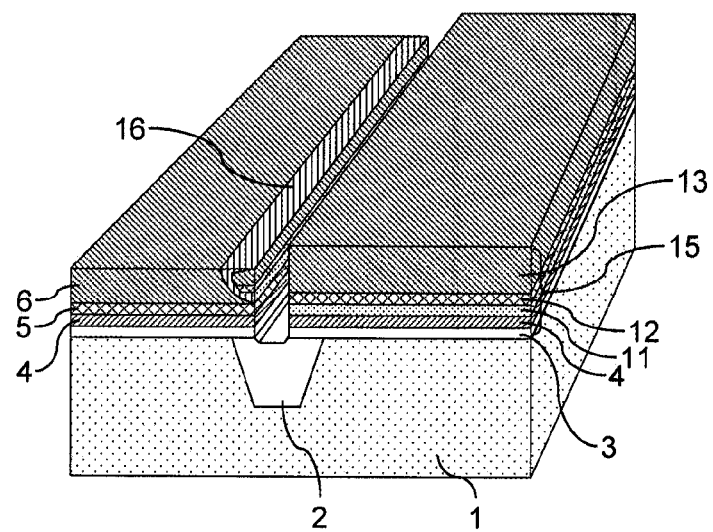
FIG. 5 is a schematic view illustrating a process of forming a gate stack layer for first and second MISFETs that has a HKMG structure.

After patterning, as shown in FIG. 5, dry etching is performed to remove silicon oxide film 7, aluminum oxide film 11, titanium nitride film 12, and polysilicon film 13 deposited in all regions except for the second region. In the second region, second GS layer 15 is formed, in which high-k insulating film 4 as a second gate insulating film, aluminum oxide film 11, titanium nitride film 12 as a second metal gate electrode, and polysilicon film 13 are layered. A trench is formed between first GS layer 9 and second GS layer 15, and silicon oxide film 3 and high-k insulating film 4 deposited on the bottom of the trench are also removed. At this time, as shown in FIG. 5, aluminum oxide film 11, titanium nitride film 12, and polysilicon film 13 that are trapped under overhang portion 10 are not etched away and left on edge 16 of first GS layer 9.

Figure 6:
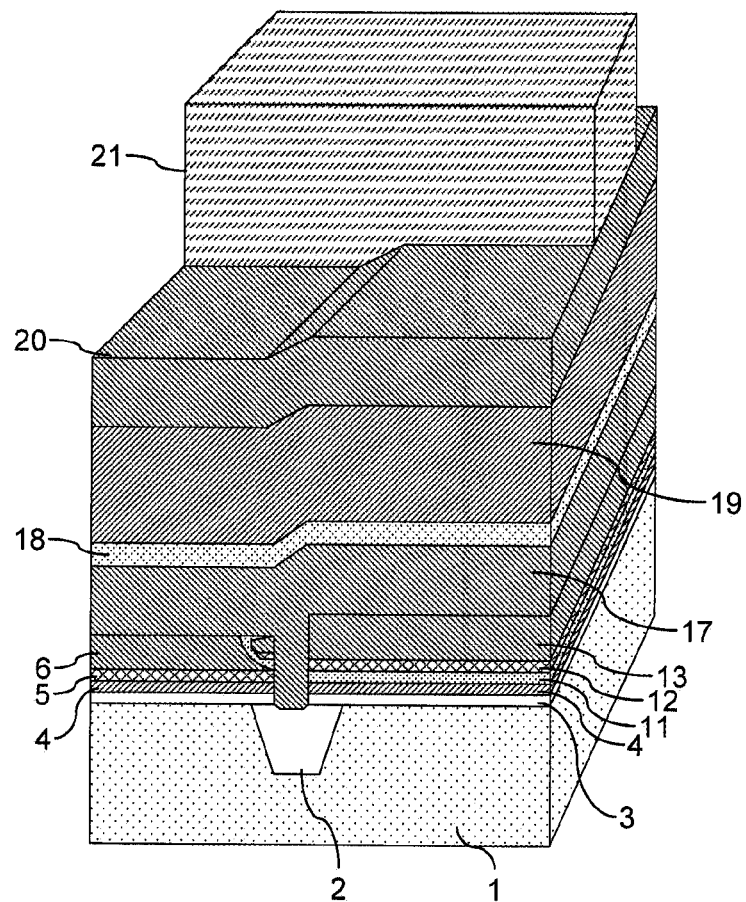
FIG. 6 is a schematic view illustrating a process of forming a gate stack layer for first and second MISFETs that has a HKMG structure.

After first GS layer 9 and second GS layer 15 are formed, polysilicon film 17 is deposited so as to fill the trench formed between the GS layers, as shown in FIG. 6. Although polysilicon film 17 shown in FIG. 6 is deposited so as to cover the first and second GS layers, the film may be deposited so as only to fill the trench formed between the GS layers.

After polysilicon film 17 is deposited, W/WN/WSi film 18 made of tungsten (W), tungsten nitride (WN), and tungsten silicide (WSi) is deposited. W/WN/WSi film 18 will serve as a line. It is noted that when polysilicon film 17 is deposited so as only to fill the trench formed between the first and second GS layers, only W/WN/WSi film 18 serves as a line. Such a structure is referred to as a bit line gate (BLG) structure.

After W/WN/WSi film 18 is deposited, silicon nitride (SiN) film 19 is deposited as a processing mask material, followed by silicon oxide film (SiO) 20. After silicon oxide film 20 is deposited, resist 21 is deposited.

After resist 21 is deposited, lithography or the like is used to pattern silicon nitride film 19 and silicon oxide film 20. After patterning, as shown in FIG. 7, first GS layer 9 and second GS layer 15 are subject to gate processing by etching.

At this time, as described above, materials of second GS layer 15, such as aluminum oxide film 11, titanium nitride film 12, and polysilicon film 13, are trapped under overhang portion 10. The materials of second GS layer 15, especially aluminum oxide film 11, impede etching, resulting in residue 22 on the edge of first GS layer 9, as shown in FIG. 7. In FIG. 7, although residue 22 is shown uniformly on the edge of first GS layer 9 for simplicity, the residue may actually be generated non-uniformly. Further, the shape of residue 22 is not limited to a triangular shape as shown in FIG. 7.

Description will now be made of a mechanism explaining how short circuit lines are generated due to residue 22.

Figure 7:
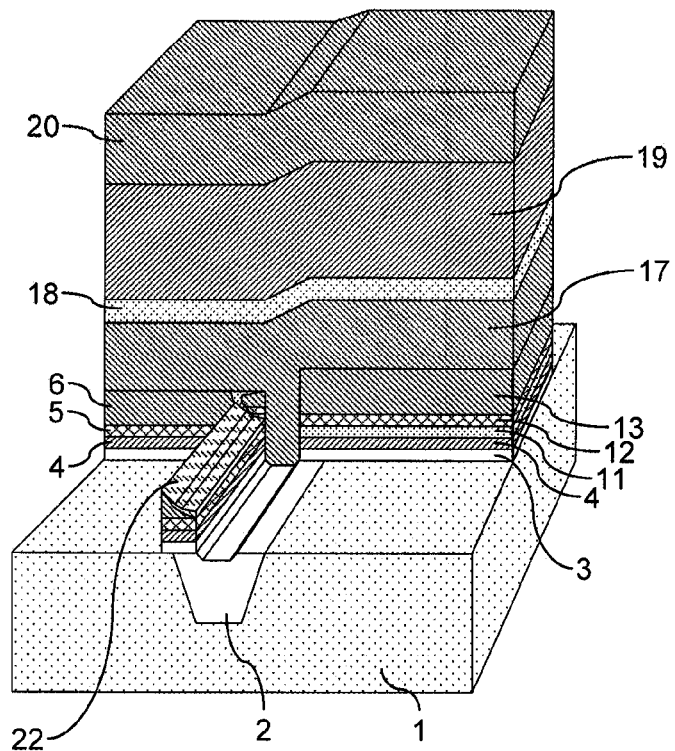
FIG. 7 is a schematic view illustrating a process of forming a gate stack layer for first and second MISFETs that has a HKMG structure.
Figure 8:
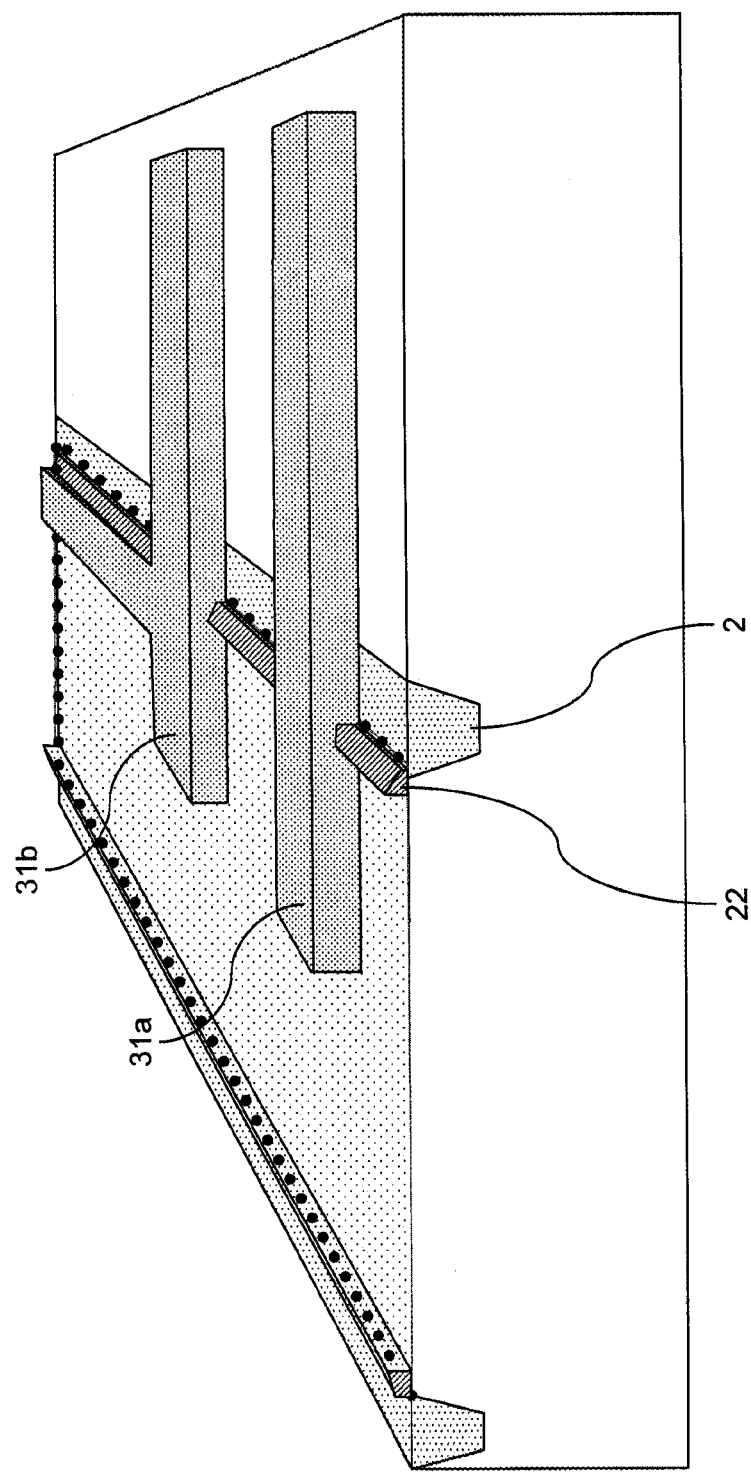
FIG. 8 is a schematic view illustrating a mechanism of how short circuit lines are generated due to residue.

FIG. 8 illustrates a state where silicon nitride film 19 and silicon oxide film 20 shown in FIG. 7 have been removed.

In FIG. 8, two lines 31a and 31b that are of different potentials are provided. It is noted that although lines 31a and 31b are each layered with high-k insulating film 4, titanium nitride film 5, polysilicon film 6, aluminum oxide film 11, titanium nitride film 12, polysilicon film 13 and 16, W/WN/WSi film 18, and the like, they are omitted in the drawing.

As described above, residue 22 is generated on the edge of the first GS layer, that is, on the border between the first region and the second region, which is indicated by dotted lines in FIG. 8. Residue 22 is conductive because the residue contains TiN and the like.

In this case, when residue 22 is in contact with both of lines 31a and 31b, residue 22 is electrically connected to both of lines 31a and 31b through polysilicon films 13 and 16, causing a short circuit to occur between the lines.

Description will now be made to a configuration of a semiconductor device according to an exemplary embodiment.

Figure 9:
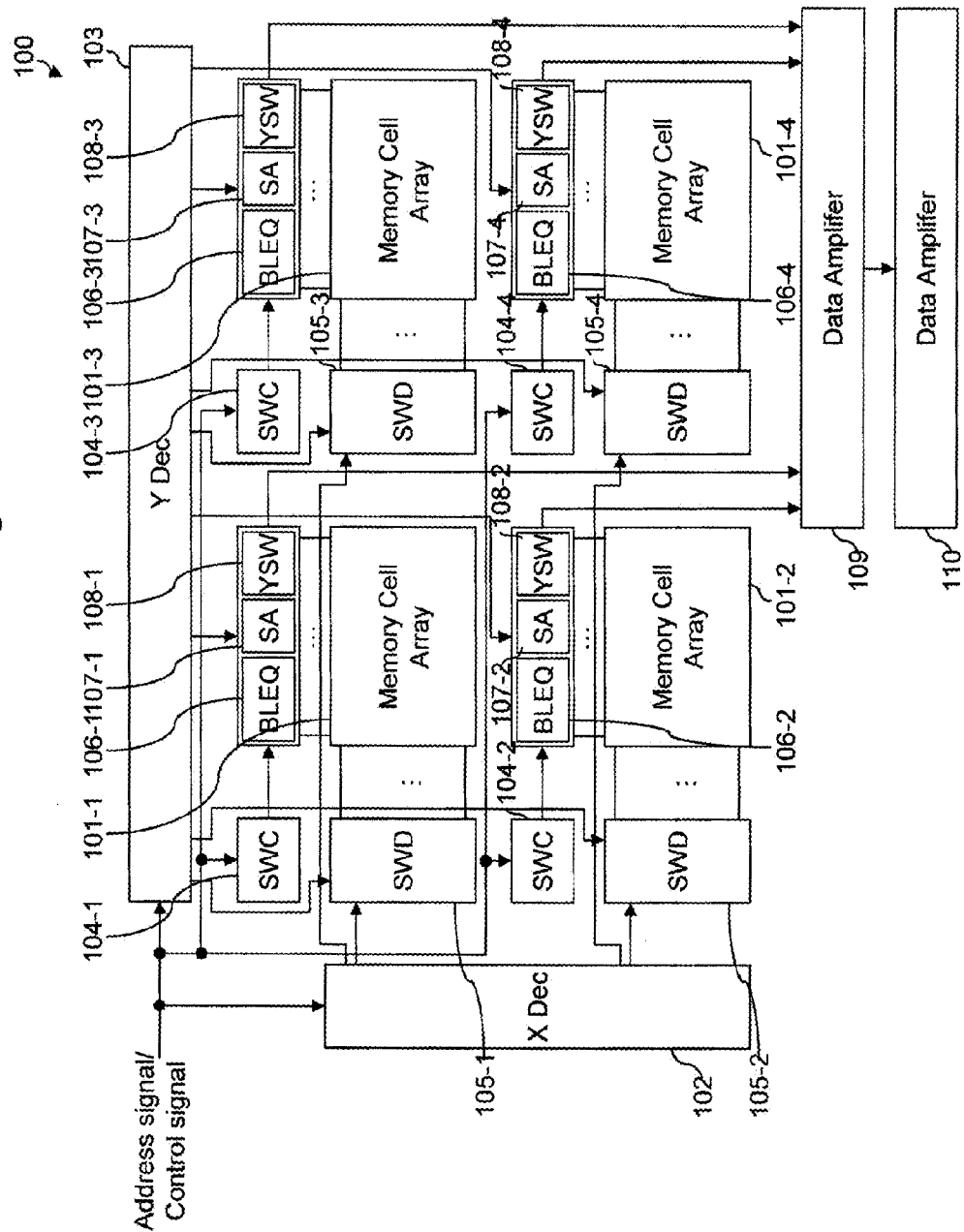
FIG. 9 is a block diagram illustrating a configuration of a semiconductor device according to an exemplary embodiment.

FIG. 9 is a block diagram illustrating a configuration of semiconductor device 100 according to an exemplary embodiment.

Semiconductor device 100 shown in FIG. 9 includes memory cell arrays 101-1 to 101-4, row decoder (X Dec) 102, column decoder (Y Dec) 103, sub-word control circuits (SWC) 104-1 to 104-4, sub-word drivers (SWD) 105-1 to 105-4, bit line equalizing (BLEQ) circuits 106-1 to 106-4, sense amplifiers 107-1 to 107-4, column switches (Y-Switch) 108-1 to 108-4, data amplifier 109, and output circuit 110.

Memory cell array 101-1 has sub-word control circuit 104-1, sub-word driver 105-1, BLEQ circuit 106-1, sense amplifier 107-1, and column switch (Y-Switch) 108-1 associated therewith. Each of memory cell arrays 101-2 to 101-4 also has the respective elements described above associated therewith in a similar association. For that reason, only memory cell array 101-1 and its associated components will be described below. Additionally, while not shown in FIG. 9, memory cell array 101-1 also has a plurality of sense amplifiers 107-1 associated therewith.

Externally provided address and control signals are input to row decoder 102, column decoder 103, and sub-word control circuit 104-1.

At memory cell array 101-1, a plurality of sub-word lines and a plurality of bit lines intersect with each other, and memory cells are located at the intersections.

Row decoder 102 selects any of the sub-word lines contained in memory cell array 101 based on the externally provided signal.

Column decoder 103 selects any of a plurality of sense amplifiers based on the externally provided signal.

Sub-word control circuit 104-1 provides operation instructions to sub-word driver 105-1, BLEQ circuit 106-1, and column switch 108-1 based on the externally provided signal.

Sub-word driver 105-1 is responsive to the instruction from sub-word control circuit 104-1 for driving a sub-word line selected by row decoder 102.

BLEQ circuit 106-1 is responsive to the instruction from sub-word control circuit 104-1 for equalizing a line potential for supplying power to sense amplifier 107-1.

Sense amplifier 107-1 is connected to the corresponding bit line of memory cell array 101-1 once it is selected by column decoder 103, and amplifies and outputs data output through the sub-word line and the bit line.

Column switch 108-1 is provided between a bit line and a data input/output line and is responsive to the instruction from sub-word control circuit 104-1 for turning itself on or off. When column switch 108-1 is turned on, data output from sense amplifiers 107-1 is output to data amplifier 109.

Data amplifier 109 amplifies data output from sense amplifiers 107-1 and outputs the data to output circuit 110.

Output circuit 110 outputs data output from data amplifier 109 to the outside of semiconductor device 100.

Figure 10:
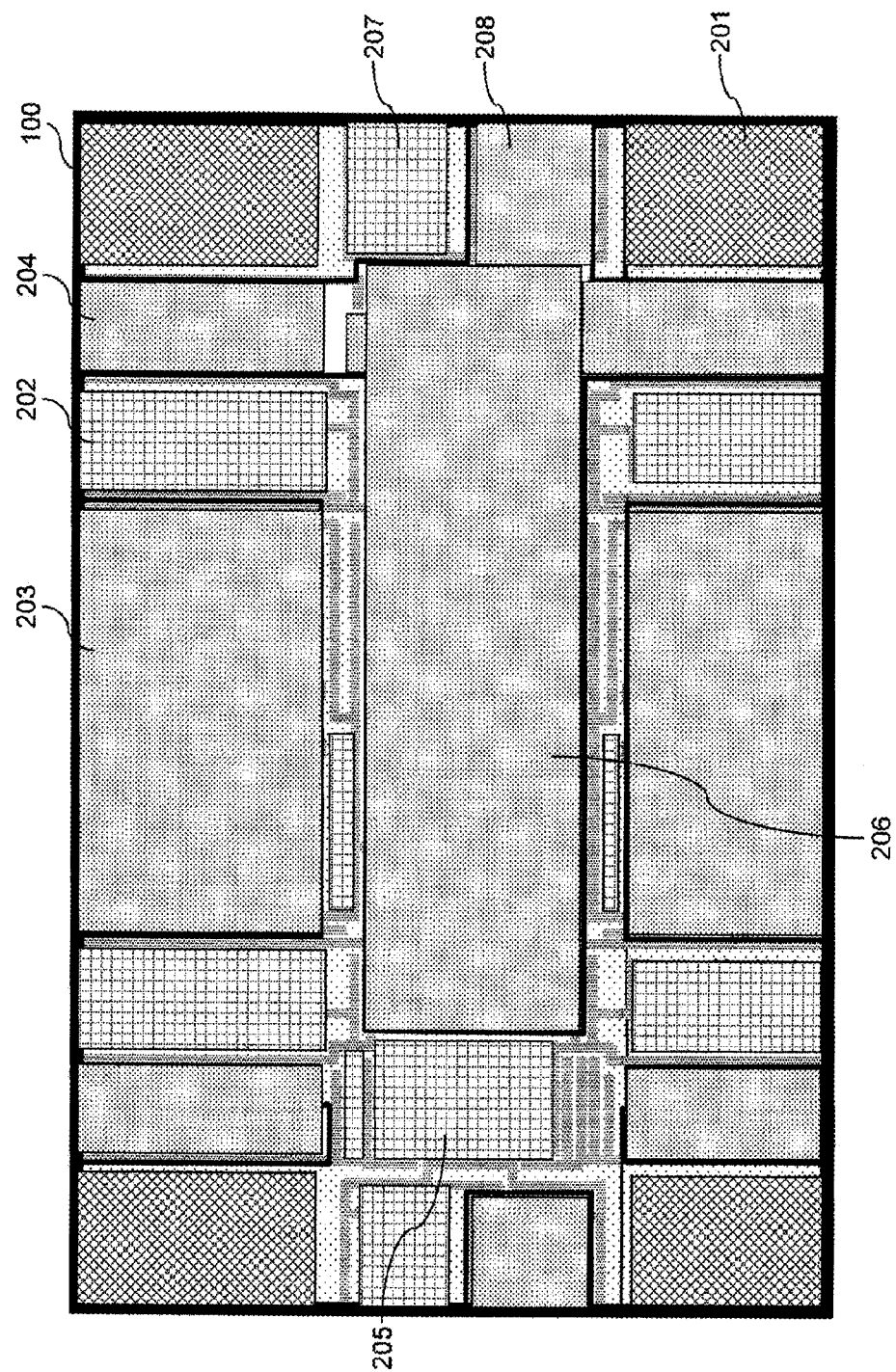
FIG. 10 is a schematic view illustrating an example circuit layout of the semiconductor device shown in FIG. 9.

FIG. 10 is a schematic view illustrating an example circuit layout of the semiconductor device in a configuration shown in FIG. 9.

As shown in FIG. 10, the following regions are formed on the periphery of region 201 where memory cell array 101 is formed: region 202 where p-channel transistors forming sense amplifier 107 are formed, region 203 where n-channel transistors forming sense amplifier 107 and BLEQ circuit 106 are formed, region 204 where p-channel transistors forming column switch 108 are formed, region 205 where p-channel transistors forming sub-word control circuit 104 are formed, region 206 where n-channel transistors forming sub-word control circuit 104 are formed, region 207 where p-channel transistors forming sub-word driver 105 are formed, and region 208 where n-channel transistors forming sub-word driver 105 are formed.

In FIG. 10, description will be omitted for row decoder 102, column decoder 103, data amplifier 109, and output circuit 110.

Even when transistors that have different conductivity types are formed as shown in FIG. 10, residue may be generated on the border between a first region, in which a first GS layer for an MISFET of one conductivity type, or p-channel type, is formed, and a second region, in which a second GS layer for an MISFET of the other conductivity type, or n-channel type, is formed.

Figure 11:
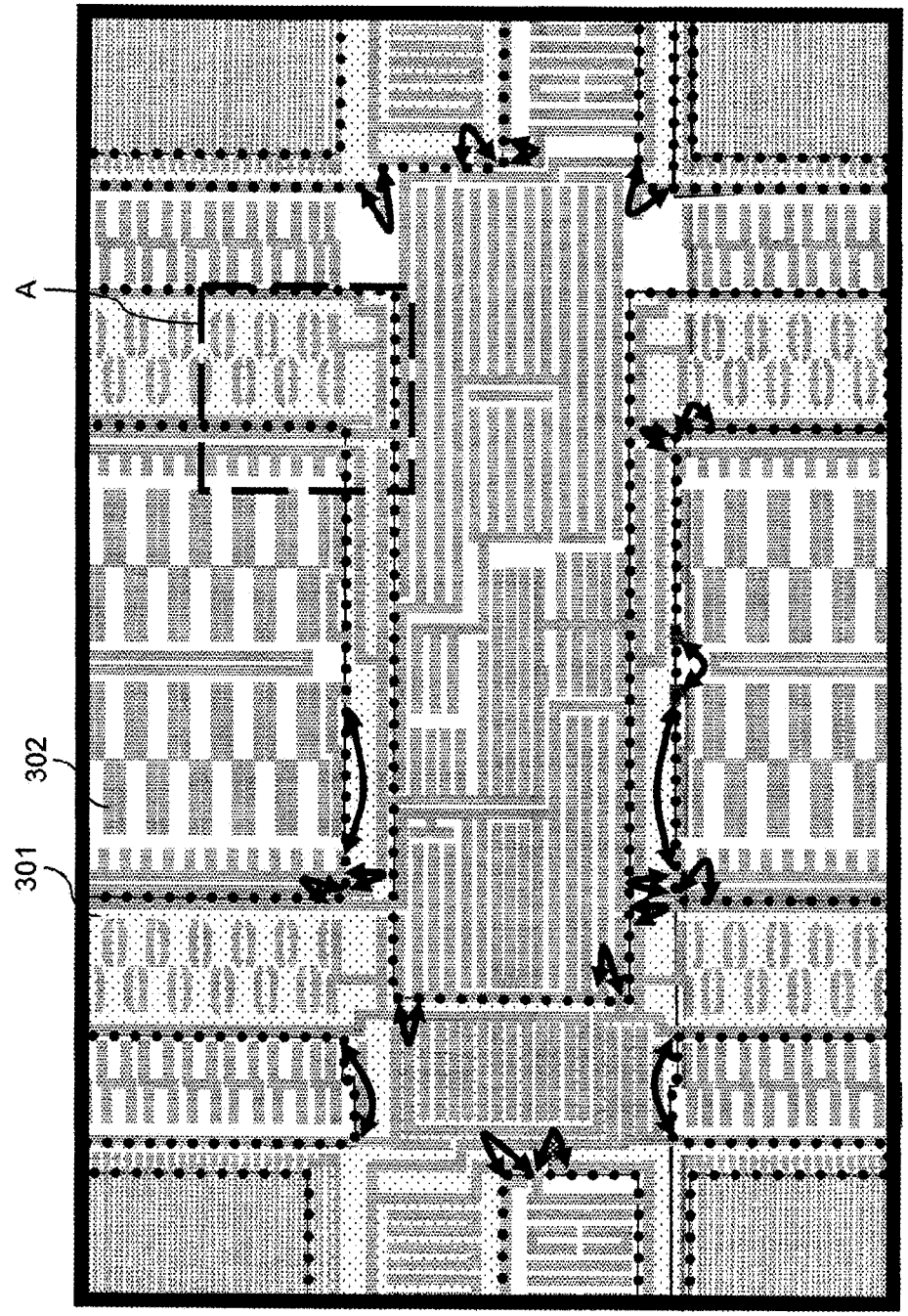
FIG. 11 is a schematic view illustrating a relation between patterns of first and second GS layers and wells on the semiconductor substrate in a related semiconductor device.

FIG. 11 is a schematic view illustrating a relation between patterns of first and second GS layers and wells (device regions) on the semiconductor substrate in the semiconductor device shown in FIG. 10.

In FIG. 11, obliquely hatched region 301 represents an n-well region.

In general, the first GS layer for p-channel MISFETs is stacked on an n-well pattern for efficient design. The n-well pattern is laid out so as to be connected to a region where p-channel MISFETs are formed. Accordingly, a pattern of the first GS layer also extends along a pattern of the n-well region. As a result, borders of the first GS layer are as indicated by dotted lines in FIG. 11.

As described above, since residue is generated on the border between the first and second GS layers, such residue is generated along the dotted lines shown in FIG. 11. When the residue overlaps with lines 302 of different potentials, a short circuit occurs between the lines. In the n-well pattern layout shown in FIG. 11, borders of the first GS layer overlap with two lines 302 of different potentials in a plurality of zones indicated by solid line arrows. In such zones, a short circuit may occur between the lines.

Figure 12:
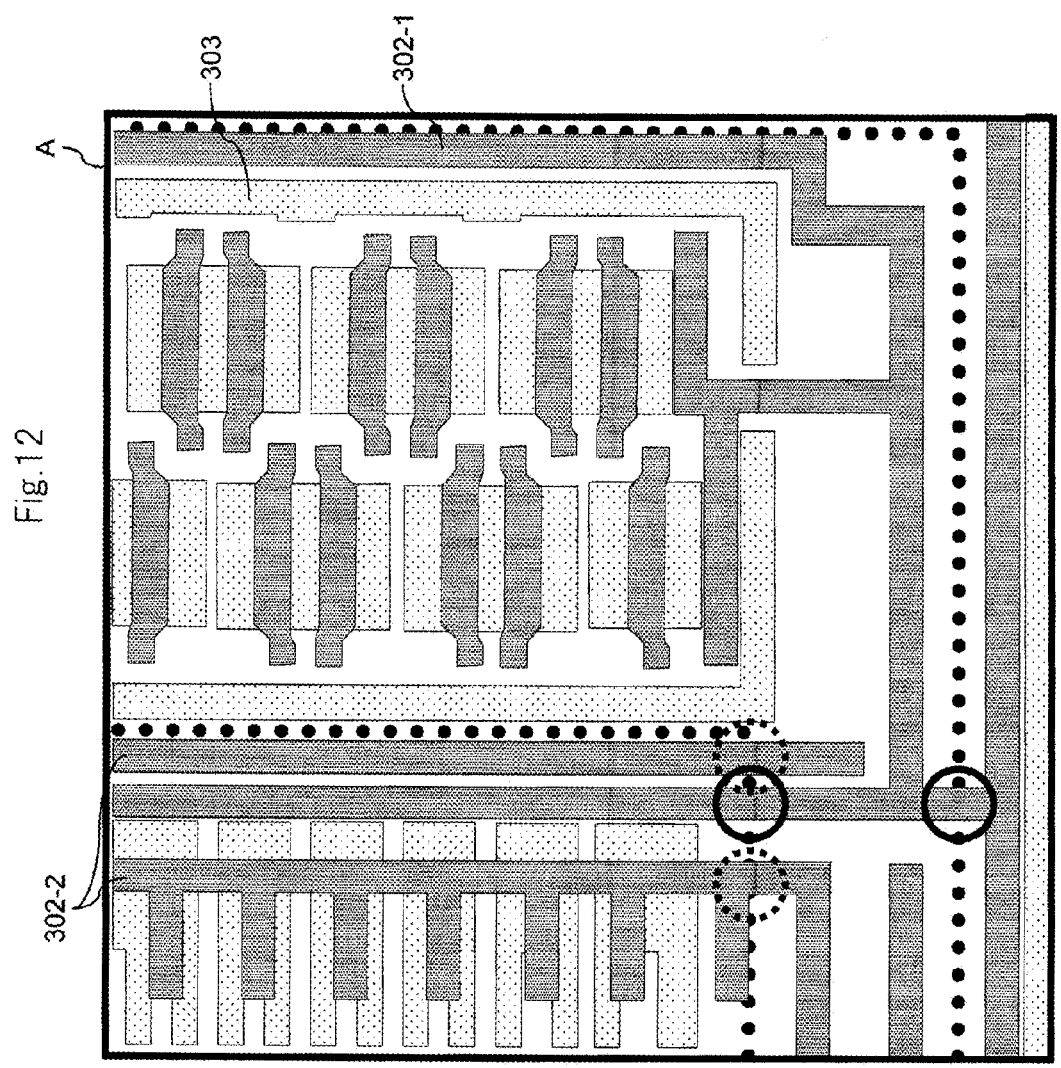
FIG. 12 is an enlarged view of a rectangular area shown in FIG. 11.

FIG. 12 is an enlarged view of rectangular area A shown in FIG. 11.

Line 302-1 is a line for an inner potential Vpp. Line 302-2 is a line for a potential VBLEQ (bit line equalizing voltage), or a potential VBLP (bit line pre-charge voltage). For example, the potential VBLEQ is 1.3 V and the potential VBLP is 0.48 V, respectively, and the potential VBLEQ and the potential VBLP are different from the potential Vpp.

Diffusion layer 303 refers to a diffusion layer such as that for source or drain of a p-channel MISFET or an n-channel MISFET and that for setting a well potential through a contact.

As shown in FIG. 12, the borders of the first GS layer indicated by dotted lines overlap with lines 302-1 and 302-2. It is noted that in FIG. 12, a solid line circle represents an intersection of line 302-1 with the border of the first GS layer, and a dotted line circle represents an intersection of line 302-2 with the border of the first GS layer. In this case, when any residue is generated along the borders of the first GS layer between the intersection of line 302-1 with the border of the first GS layer and the intersection of line 302-2 with the border of the first GS layer, a short circuit may occur between line 302-1 and line 302-2.

Description will now be made to a relation between patterns of first and second GS layers and wells on the semiconductor substrate in semiconductor device 100 according to an exemplary embodiment.

Figure 13:
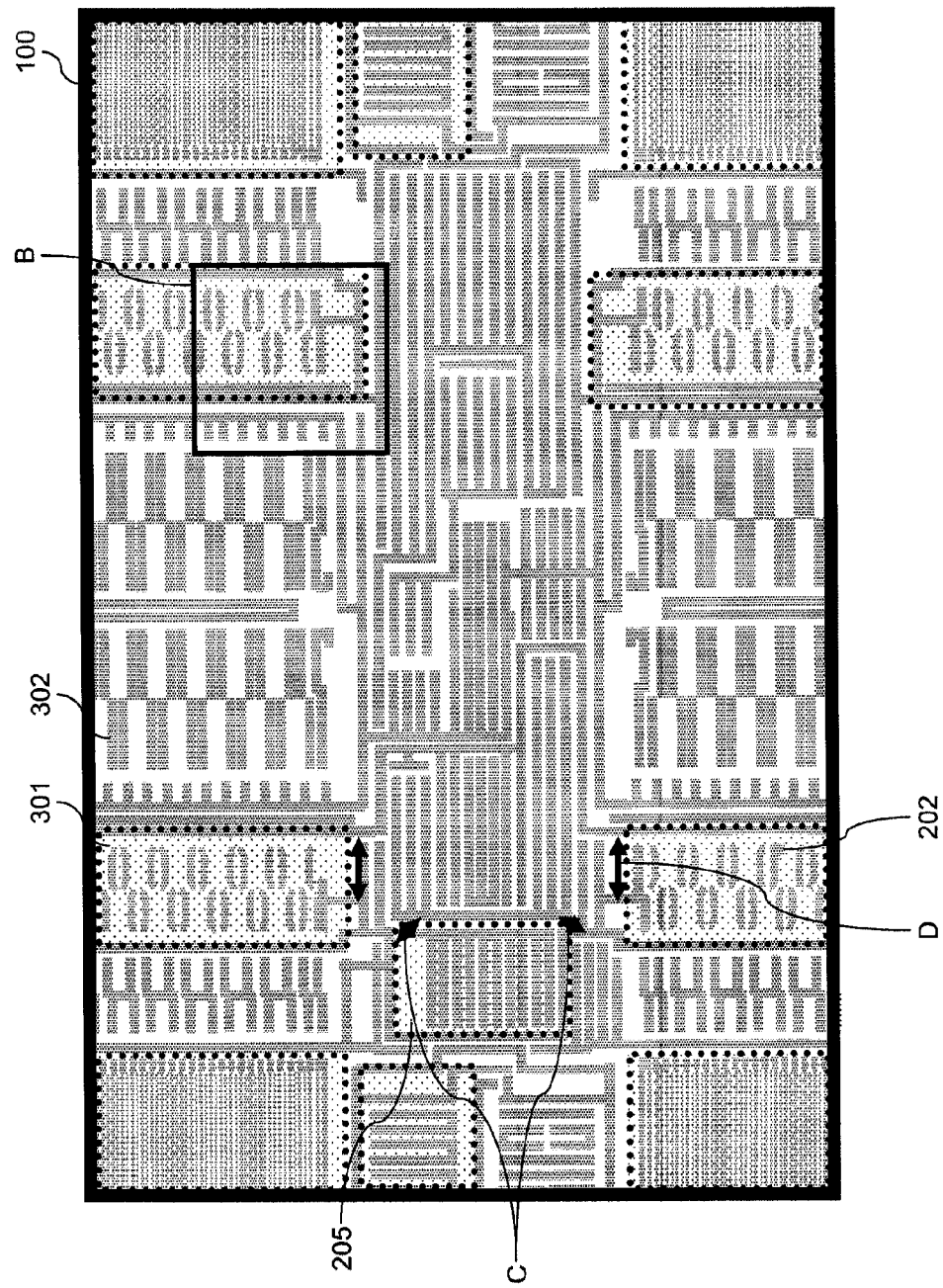
FIG. 13 is a schematic view illustrating a relation between patterns of first and second GS layers and wells on the semiconductor substrate in a semiconductor device according to an exemplary embodiment.

FIG. 13 is a schematic view illustrating a relation between patterns of first and second GS layers and wells on the semiconductor substrate in semiconductor device 100 according to an exemplary embodiment. In FIG. 13, same reference numerals represent components similar to those in FIG. 11, and the description will be omitted.

Semiconductor device 100 according to the exemplary embodiment is different from the semiconductor device shown in FIG. 11 in that n-well patterns on which a first GS layer is stacked are discontinuous and spaced apart as islands. Forming n-well patterns as islands can prevent the borders of the first GS layer from overlapping with two lines of different potentials.

Figure 14:
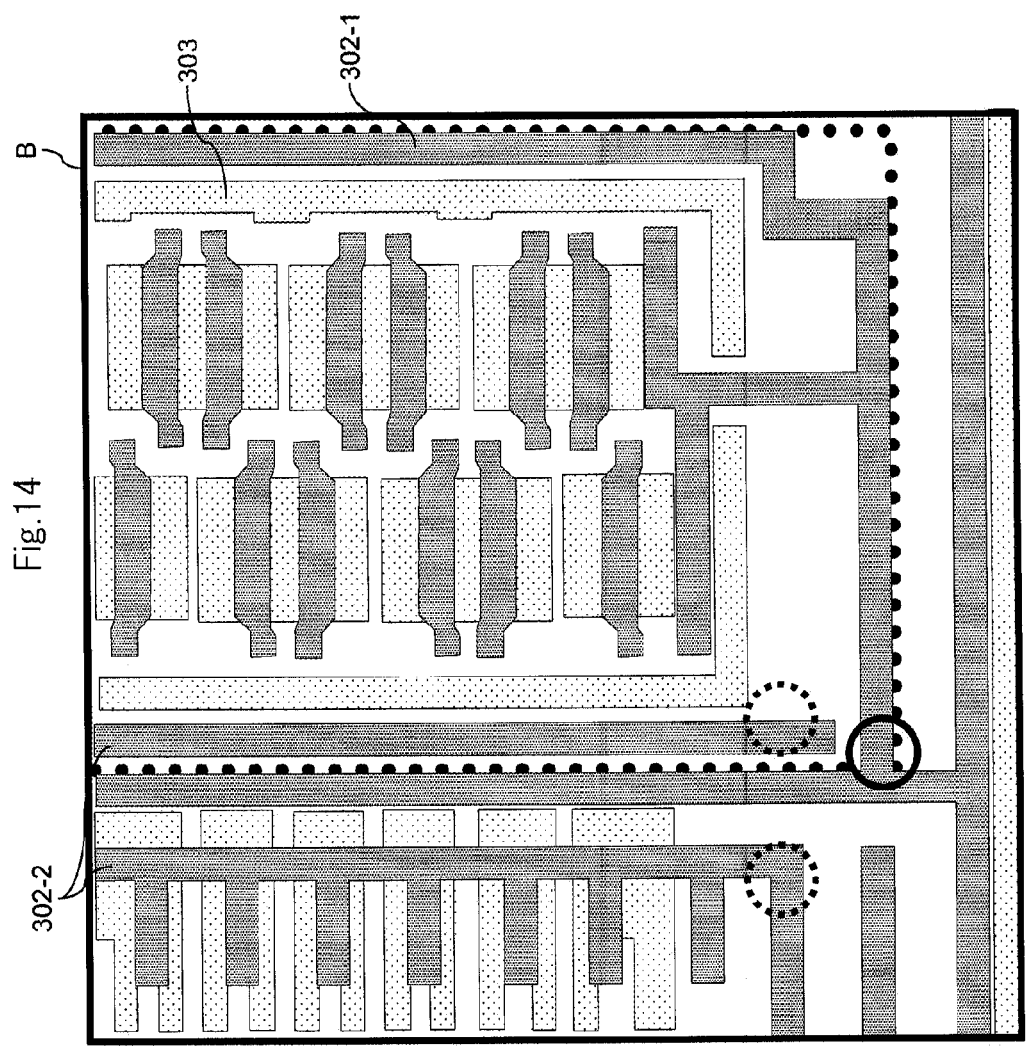
FIG. 14 is an enlarged view of a rectangular area shown in FIG. 13.

FIG. 14 is an enlarged view of rectangular area B shown in FIG. 13. Rectangular area A and rectangular area B are in a corresponding positional relationship with each other. In FIG. 14, same reference numerals represent components similar to those in FIG. 12, and description will be omitted.

As described above, n-well patterns, or areas on which p-channel MISFETs are formed are spaced apart as islands. Consequently, as shown in FIG. 14, the borders of the first GS layer overlap with a first line, or line 302-1, but not with a second line, or line 302-2. In this way, even if any residue is generated on the borders of the first GS layer, a short circuit caused by the residue can be prevented from occurring between line 302-1 and line 302-2.

Even when n-well patterns are formed as islands, a short circuit caused by residue may occur in a peripheral zone of region 205 (zone C) and a peripheral zone of region 202 (zone D) as shown in FIG. 13.

Description will now be made to explain how a short circuit caused by residue can be prevented in zones C and D described above.

First, description will be made to explain how a short circuit caused by residue can be prevented in zone C described above.

Figure 15:
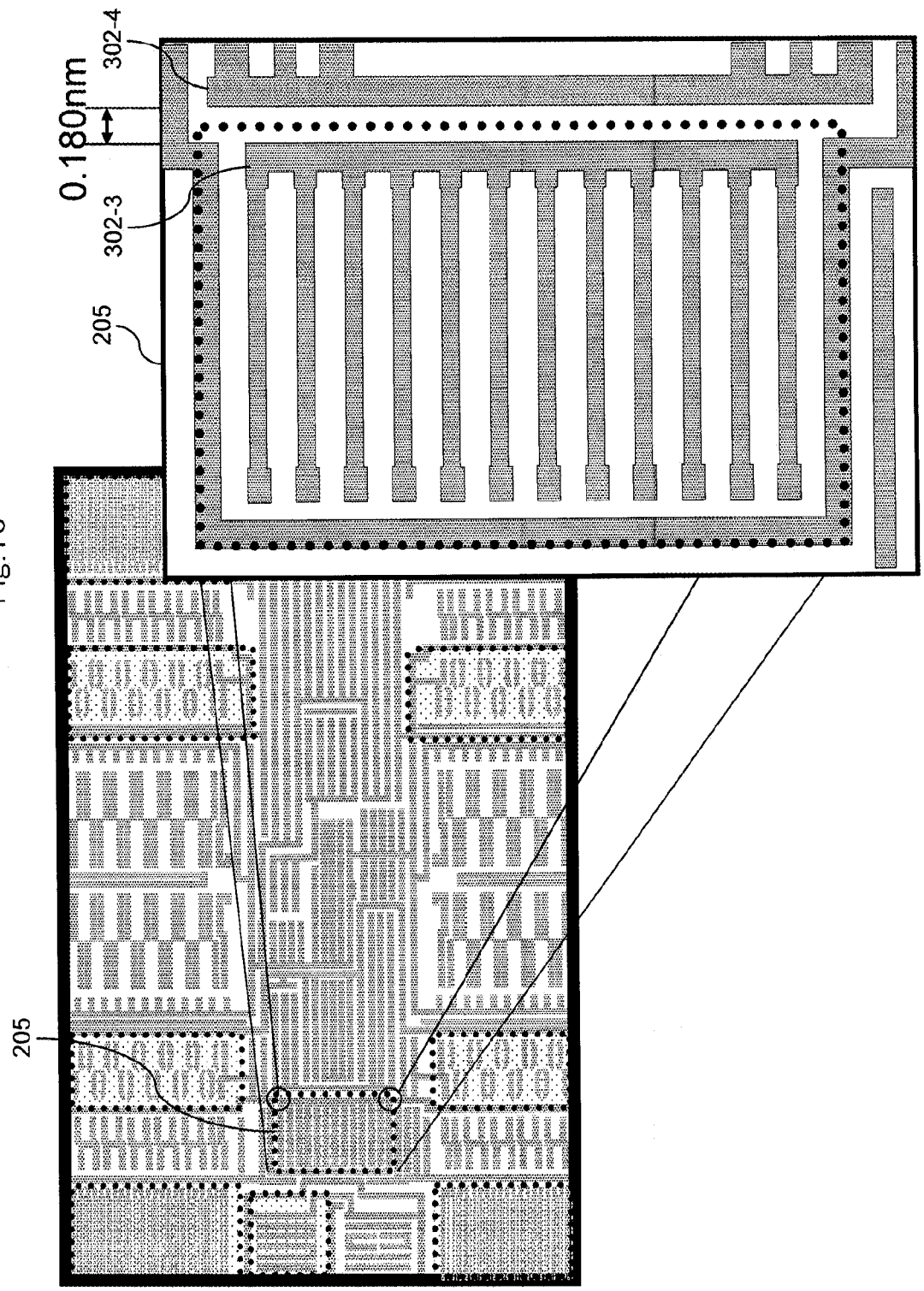
FIG. 15 is a schematic view illustrating how a short circuit caused by residue can be prevented.

FIG. 15 is an enlarged view of zone C and its vicinity shown in FIG. 13.

As shown in FIG. 15, line 302-3 and line 302-4, which are of different potentials, are close to each other in a part of the zone. In this part, when a border of the first GS layer overlaps with lines 302-3 and 302-4, a short circuit may occur between the lines. At this point, the spacing between line 302-3 and line 302-4 is approximately 180 nm in general. Accordingly, in order to prevent a short circuit from occurring, it is only necessary to locate the border of the first GS layer within the spacing of approximately 180 nm. The border of the GS layer can be located within the spacing of approximately 180 nm by using a KrF (excimer laser) exposure device, for example.

Next, description will be made to explain how a short circuit caused by residue can be prevented in zone D described above.

Figure 16A:
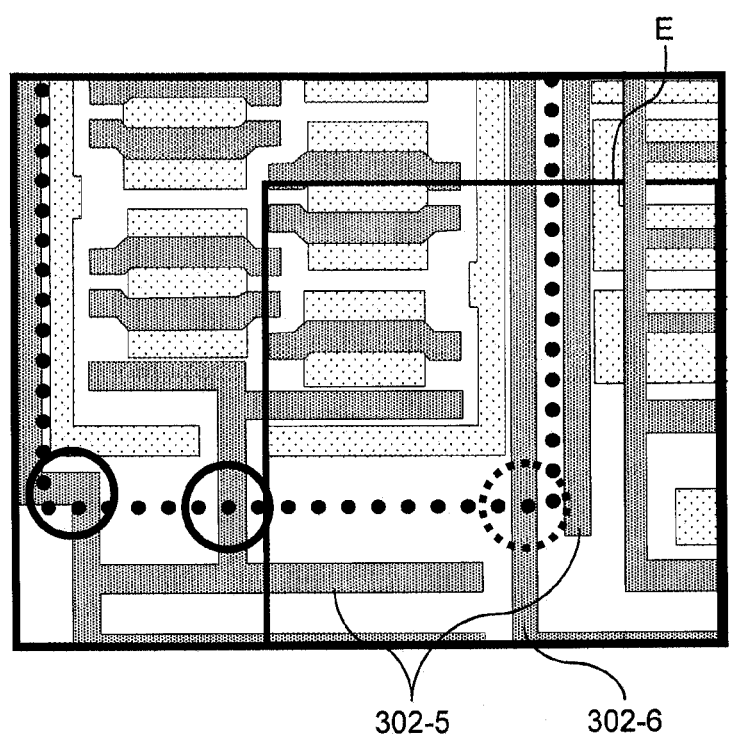
FIG. 16A is a schematic view illustrating how a short circuit caused by residue can be prevented.

FIG. 16A is an enlarged view of zone D and its vicinity shown in FIG. 13.

In FIG. 16A, line 302-5 is a line for an n-well potential and line 302-6 is a line for a potential VBLP. A solid line circle represents the intersection of line 302-5 with the border of the first GS layer, and a dotted line circle represents the intersection of line 302-6 with the border of the first GS layer.

As shown in FIG. 16A, the border of the first GS layer overlaps with lines 302-5 and 302-6. In this case, when any residue is generated along the borders of the first GS layer between the intersection of line 302-5 with the border of the first GS layer and the intersection of line 302-6 with the border of the first GS layer, a short circuit may occur between the lines.

Figure 16B:
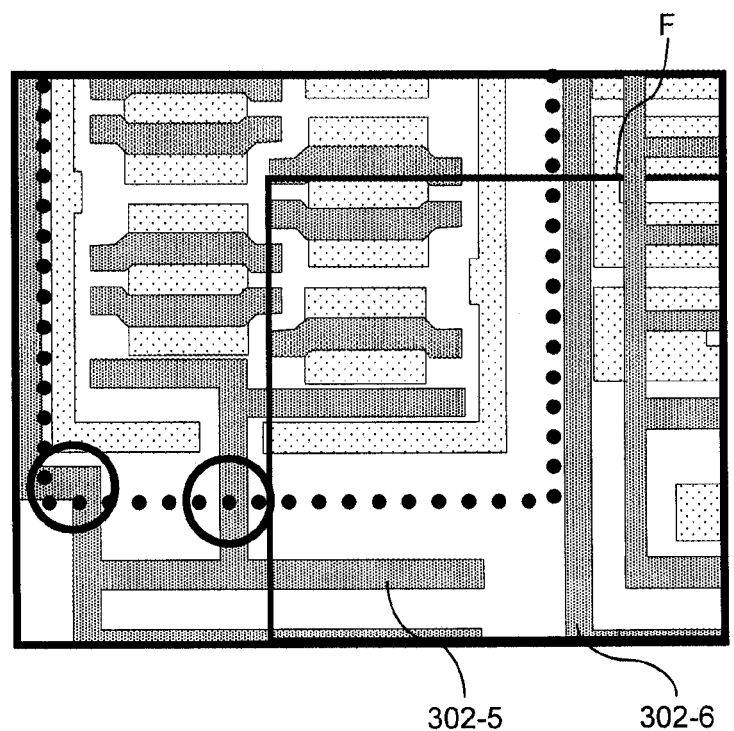
FIG. 16B is a schematic view illustrating how a short circuit caused by residue can be prevented.

Accordingly, the layout of line 302-5 and line 302-6 may be altered as shown in FIG. 16B so as to prevent a short circuit from occurring even if some residue is generated on the border of the first GS layer. Specifically, in altering the layout, line 302-5 extending in a region on the right side of line 302-6 in FIG. 16A is eliminated and line 302-6 extends instead in the region as shown in FIG. 16B, so that the borders of the first GS layer overlap with line 302-5, but not with line 302-6. In this way, even if some residue is generated on the borders of the first GS layer, a short circuit can be prevented from occurring.

Description will be made in further detail to explain how a short circuit caused by a residue can be prevented in zone D described above.

Figure 17A:
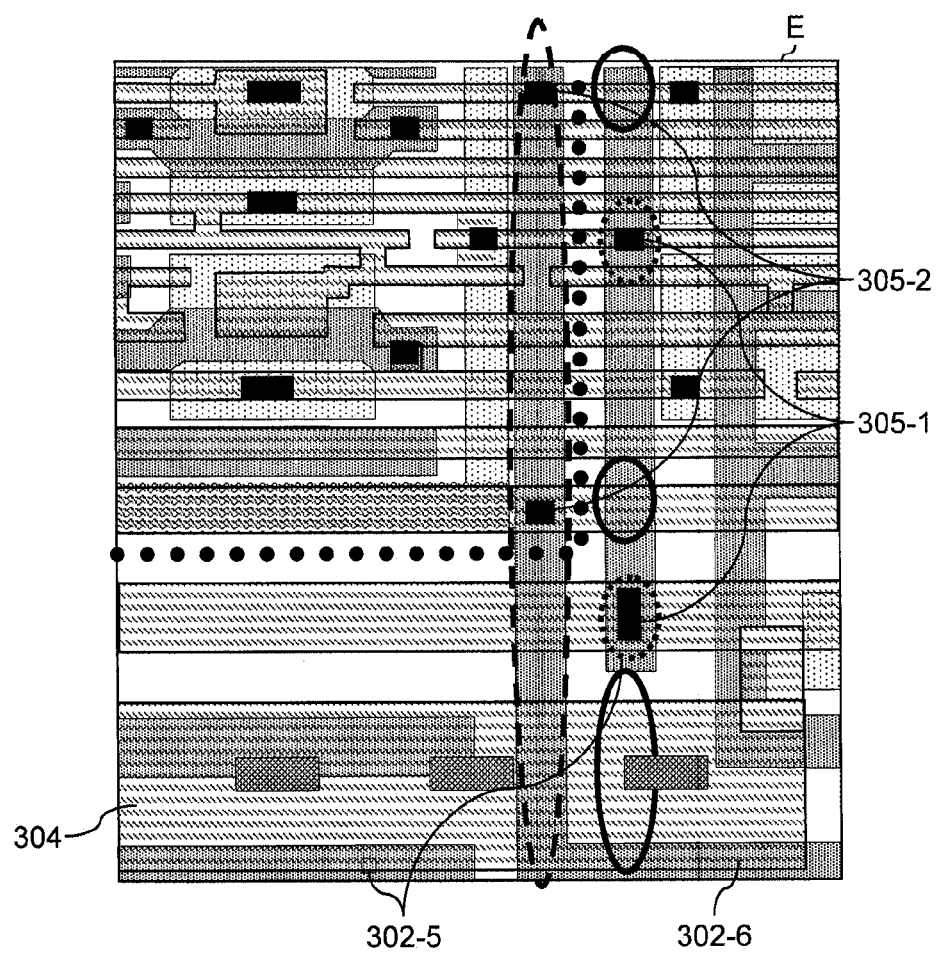
FIG. 17A is a schematic view illustrating how a short circuit caused by residue can be prevented.

FIG. 17A is an enlarged view of rectangular area E shown in FIG. 16A.

FIG. 17A shows contacts 305 that connect lines 302-5 and 302-6 with lines 304 formed in a different layer from lines 302-5 and 302-6. Lines 304 include a line for an n-well potential, a line for a potential VBLP, and the like. Line 302-5 is connected to the line for an n-well potential through contact 305-1 and exhibits the n-well potential. Line 302-6 is connected to the line for a potential VBLP through contact 305-2 and exhibits the potential VBLP.

Figure 17B:
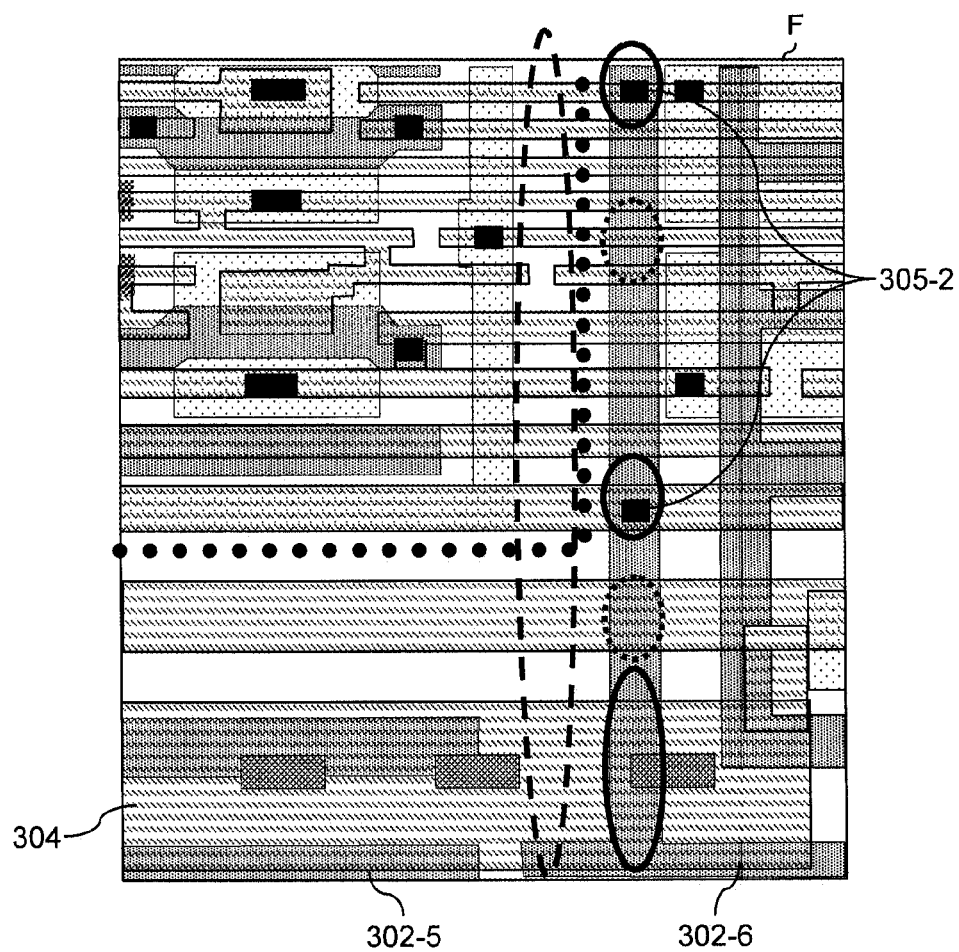
FIG. 17B is a schematic view illustrating how a short circuit caused by residue can be prevented.

FIG. 17B is an enlarged view of rectangular area F shown in FIG. 16B. Rectangular area F corresponds to rectangular area E.

As shown in FIG. 17B, the layout of line 302-5 and line 302-6 is altered so that the border of the first GS layer overlaps only with line 302-5. The alteration of the layout of line 302-5 and line 302-6 also requires alteration of the layout of contacts 305-1 and 305-2. Specifically, contacts 305-2 provided in the region circled by a dashed line in FIG. 17A, in which line 302-6 has extended, are relocated to the region circled by solid lines. It is noted that, in FIGS. 17A and 17B, the spacing between two contacts 305-2 is kept the same. In addition, contacts 305-1 provided in the region circled by a dotted line in FIG. 17A, which connect line 302-5 which extends on the right side of line 302-6 with line 304 for an n-well potential are deleted. In this way, line 302-5 can assume an n-well potential and line 302-6 can assume a potential VBLP.

As described above, according to the exemplary embodiments, the semiconductor device 100 includes a first region on Si substrate 1, in which a first transistor is formed, the first transistor including a high-k insulating film containing a high dielectric constant material and a metal gate electrode formed on the high-k insulating film; a second region on Si substrate 1, in which a second transistor is formed, the second transistor including a high-k insulating film and a metal gate electrode formed on the high-k insulating film, a layered structure of electrode materials of the second transistor being different from a layered structure of electrode materials of the first transistor; and a first line and a second line, the lines being of different potentials, wherein a border of the first region and the second region overlaps with at most only the first line or the second line.

Consequently, even if any residue is generated along the border of the first region and the second region, a short circuit can be prevented from occurring between the lines because the residue is no longer in contact with the two lines of different potentials.

This application is based upon and claims the benefit of priority from the prior Japanese Application No. 2011-207329 filed on Sep. 22, 2011; the entire contents of which are incorporated herein by reference.

It is apparent that the present invention is not limited to the above embodiments, but may be modified and changed without departing from the scope and spirit of the invention.

The invention claimed is:

1. A semiconductor device comprising:
a semiconductor substrate;
a first region on said semiconductor substrate, in which a first transistor is formed, the first transistor including a first gate insulating film containing a high dielectric constant material and a first metal gate electrode formed on the first gate insulating film;
a second region adjacent to said first region on said semiconductor substrate, in which a second transistor is formed, the second transistor including a second gate insulating film containing a high dielectric constant material and a second metal gate electrode formed on the second gate insulating film, a layered structure of electrode materials of the second transistor being different from a layered structure of electrode materials of the first transistor;
a trench isolation region embedded in said semiconductor substrate at a border between said first and second regions; and
a first line and a second line that have different potentials and that are arranged above said semiconductor substrate, each of said first and second lines including at least one of the first gate insulating film and the second gate insulating film,
wherein only one of said first line and said second line crosses said trench isolation region above said semiconductor substrate.

2. The semiconductor device according to claim 1, wherein the first gate insulating film and the second gate insulating film are composed of a same high dielectric constant material,
a gate of the first transistor is formed by depositing the high dielectric constant material on said semiconductor substrate, followed by an electrode material of the first metal gate electrode, and by removing the electrode material of the first metal gate electrode deposited in a region except for said first region, and
a gate of the second transistor has been formed by depositing an electrode material of the second metal gate electrode after the electrode material of the first metal gate electrode is removed, and removing the electrode material of the second metal gate electrode deposited in a region except for said second region.

3. The semiconductor device according to claim 1, wherein the first transistor and the second transistor each have a different type of conductivity.

4. The semiconductor device according to claim 1, wherein the first transistor and the second transistor have different threshold voltages.

5. The semiconductor device according to claim 1, wherein the first gate insulating film contains a high dielectric constant material of HfO or HfSiO.

6. The semiconductor device according to claim 1, wherein the second gate insulating film contains a high dielectric constant material of HfO or HfSiO.

7. The semiconductor device according to claim 1, wherein the first metal gate electrode is titanium nitride.

8. The semiconductor device according to claim 1, wherein the first metal gate electrode is titanium nitride and the second metal gate electrode is titanium nitride having a different composition from the titanium nitride of the first metal gate electrode.

9. A semiconductor device comprising:
a semiconductor substrate;
a first region on said semiconductor substrate, in which a first transistor is formed, the first transistor including a first gate insulating film and a first gate electrode formed on the first gate insulating film;
a second region adjacent to said first region on said semiconductor substrate, in which a second transistor is formed, the second transistor including a second gate insulating film and a second gate electrode formed on the second gate insulating film, a layered structure of electrode materials of the second transistor being different from a layered structure of electrode materials of the first transistor;
a trench isolation region embedded in said semiconductor substrate at a border between said first and second regions; and
a first line and a second line that have different potentials and that are arranged above said semiconductor substrate, each of the first and second lines including at least one of the first gate insulating film and the second gate insulating film, wherein only one of said first line and said second line crosses said trench isolation region above said semiconductor substrate.

10. The semiconductor device according to claim 9, wherein the first gate insulating film and the second gate insulating film contain a high dielectric constant material.

11. The semiconductor device according to claim 9, wherein the first gate electrode and the second gate electrode are a metal gate electrode.

12. The semiconductor device according to claim 9, wherein the first transistor and the second transistor each have a different type of conductivity.

13. The semiconductor device according to claim 9, wherein the first transistor and the second transistor have different threshold voltages.

14. The semiconductor device according to claim 9, wherein the first gate insulating film contains a high dielectric constant material of HfO or HfSiO.

15. The semiconductor device according to claim 9, wherein the second gate insulating film contains a high dielectric constant material of HfO or HfSiO.

16. A semiconductor device comprising:
a semiconductor substrate;
a first region on said semiconductor substrate in which a first transistor is formed, the first transistor including a first gate insulating film and a first gate electrode formed on the first gate insulating film;
a second region adjacent to said first region on said semiconductor substrate, in which a second transistor is formed, the second transistor including a second gate insulating film and a second gate electrode formed on the second gate insulating film, a layered structure of electrode materials of the second transistor being different from a layered structure of electrode materials of the first transistor;
a trench isolation region embedded in said semiconductor substrate at a border between said first and second regions; and
a first line and a second line that have different potentials and that are arranged above said semiconductor substrate, each of said first line and said second line including at least one of the layered structure of the electrode materials of the first transistor and the layered structure of the electrode materials of the second transistor,
wherein only one of said first line and said second line crosses said trench isolation region above said semiconductor substrate.

17. The semiconductor device according to claim 16,
wherein the first gate insulating film and the second insulating film contain a high dielectric constant material, and
wherein each of said first line and said second line includes at least one of the first gate insulating film and the second gate insulating film.

18. The semiconductor device according to claim 1, further comprising a residue on said trench isolation region.

19. The semiconductor device according to claim 9, further comprising a residue on said trench isolation region.

20. The semiconductor device according to claim 16, further comprising a residue on said trench isolation region.

\* \* \* \* \*